United States Patent
Chen et al.

(10) Patent No.: US 10,852,649 B2
(45) Date of Patent: *Dec. 1, 2020

(54) METHODS AND APPARATUS FOR REMOVING CONTAMINATION FROM LITHOGRAPHIC TOOL

(71) Applicant: TAIWAN SEMICONDUCTOR MANUFACTURING CO., LTD., Hsinchu (TW)

(72) Inventors: Zi-Wen Chen, Taichung (TW); Po-Chung Cheng, Longxing Village (TW); Chih-Tsung Shih, Hsinchu (TW); Li-Jui Chen, Hsinchu (TW); Shih-Chang Shih, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/740,756

(22) Filed: Jan. 13, 2020

(65) Prior Publication Data

US 2020/0150550 A1 May 14, 2020

Related U.S. Application Data

(60) Continuation of application No. 16/655,164, filed on Oct. 16, 2019, now Pat. No. 10,534,279, which is a
(Continued)

(51) Int. Cl.
*G03F 7/20* (2006.01)
*G01B 11/27* (2006.01)
(Continued)

(52) U.S. Cl.
CPC ........ *G03F 7/70925* (2013.01); *G01B 11/272* (2013.01); *G01M 11/0271* (2013.01);
(Continued)

(58) Field of Classification Search
CPC .............. G01B 11/272; G01M 11/0271; G03F 7/70666; G03F 7/7085; G03F 7/70925;
(Continued)

(56) References Cited

U.S. PATENT DOCUMENTS 9,105,490 B2 8/2015 Wang et al.
9,236,267 B2 1/2016 De et al.
(Continued)

OTHER PUBLICATIONS

Non-final Office Action issued in related U.S. Appl. No. 15/898,813, dated Apr. 5, 2019.
(Continued)

*Primary Examiner* — Colin W Kreutzer
(74) *Attorney, Agent, or Firm* — McDermott Will & Emery LLP

(57) ABSTRACT

Embodiments described herein provide a method for cleaning contamination from sensors in a lithography tool without requiring recalibrating the lithography tool. More particularly, embodiments described herein teach cleaning the sensors using hydrogen radicals for a short period while the performance drifting is still above the drift tolerance. After a cleaning process described herein, the lithography tool can resume production without recalibration.

20 Claims, 7 Drawing Sheets

Related U.S. Application Data division of application No. 15/898,813, filed on Feb. 19, 2018, now Pat. No. 10,509,334.

(60) Provisional application No. 62/565,791, filed on Sep. 29, 2017.

(51) Int. Cl.
*G03F 9/00* (2006.01)
*G01M 11/02* (2006.01)

(52) U.S. Cl.
CPC ........ *G03F 7/7085* (2013.01); *G03F 7/70666* (2013.01); *G03F 7/70975* (2013.01); *G03F 9/7046* (2013.01); *G03F 9/7096* (2013.01)

(58) Field of Classification Search
CPC ... G03F 7/70975; G03F 9/7046; G03F 9/7096
USPC ........................................ 355/30, 67, 68, 77
See application file for complete search history.

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,534,279 B1 * | 1/2020 | Chen | G03F 7/70925 |
| 2004/0165160 A1 | 8/2004 | Van Beek et al. | |
| 2008/0083878 A1 | 4/2008 | Ehm et al. | |
| 2008/0083885 A1 | 4/2008 | Wilhelmus Van Herpen et al. | |
| 2011/0037961 A1 | 2/2011 | Moors et al. | |
| 2012/0006258 A1 | 1/2012 | Schasfoort et al. | |
| 2015/0077728 A1 | 3/2015 | Laurent et al. | |
| 2017/0052459 A1 | 2/2017 | Kaneko et al. | |

OTHER PUBLICATIONS

Notice of Allowance issued in related U.S. Appl. No. 15/898,813, dated Aug. 14, 2019.

Notice of Allowance issued in related U.S. Appl. No. 16/655,164, dated Nov. 21, 2019.

* cited by examiner

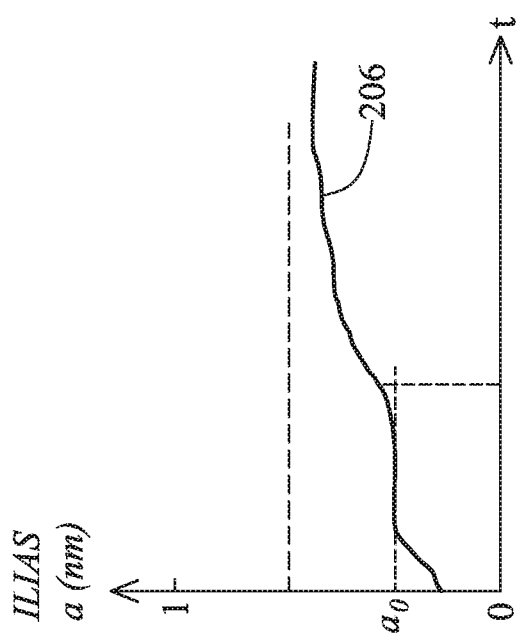

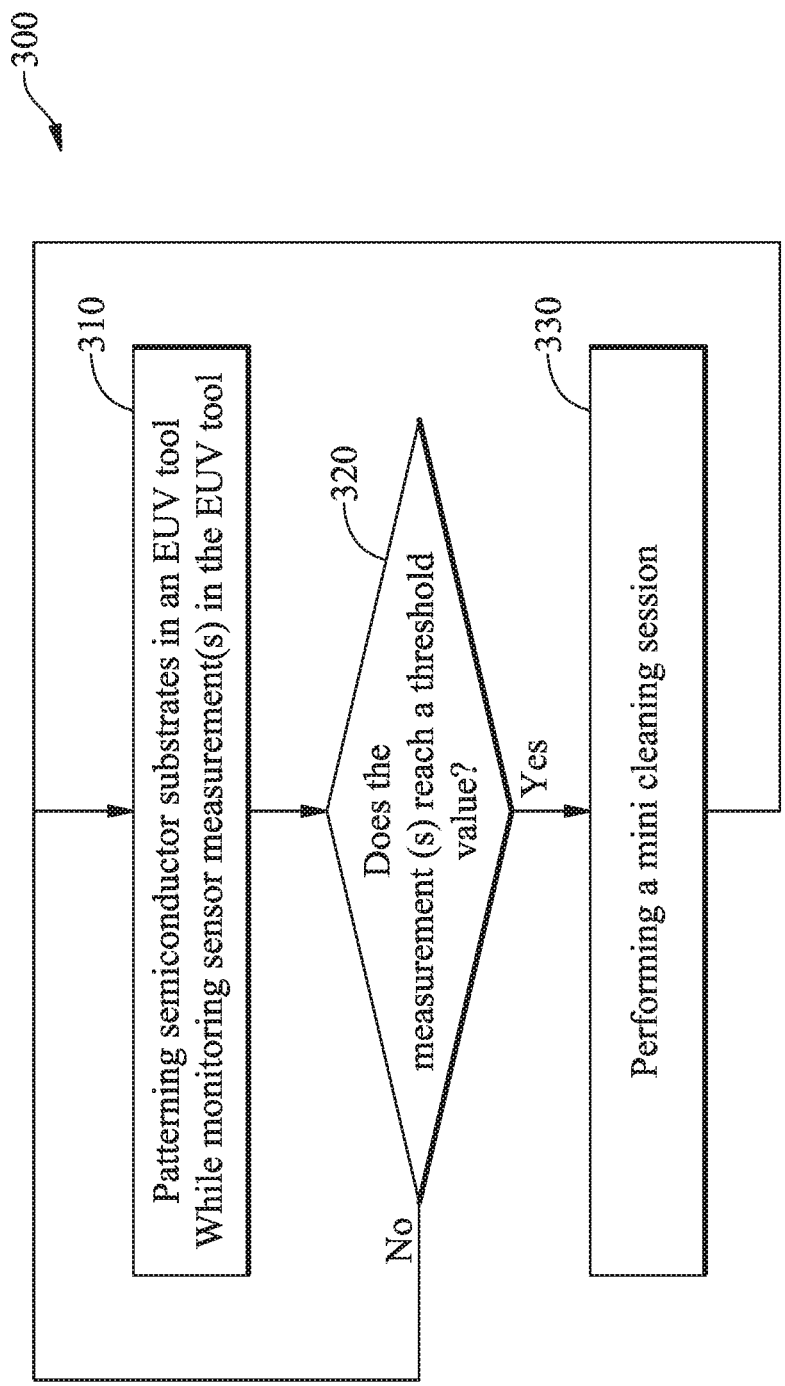

METHODS AND APPARATUS FOR REMOVING CONTAMINATION FROM LITHOGRAPHIC TOOL

CROSS-REFERENCE TO RELATED APPLICATIONS

This application is a continuation application of U.S. patent application Ser. No. 16/655,164 filed Oct. 16, 2019, which is a divisional application of U.S. patent application Ser. No. 15/898,813 filed Feb. 19, 2018, which claims priority to U.S. Provisional Patent Application 62/565,791, filed on Sep. 29, 2017, the entire disclosures of both of which are incorporated herein by reference.

BACKGROUND

In semiconductor manufacturing, lithographic apparatus is used to apply patterns onto a substrate by selectively exposing a photoresist layer on the substrate to a radiation source. The size and/or density of features in the patterns may be limited by the wavelength of the radiation source used by the lithographic apparatus. Extreme ultraviolet (EUV) lithography, which uses extreme ultraviolet (EUV) radiation or soft x-ray, i.e. radiation with wavelength shorter than 130 nm, has become one of the lithography methods for forming smaller semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C are schematic plots of sensor measurements in the EUV illumination tool according to some embodiments.

FIG. 3 is a schematic flow chart of a method for patterning semiconductor substrates according to some embodiments.

DETAILED DESCRIPTION

Figure 1A:
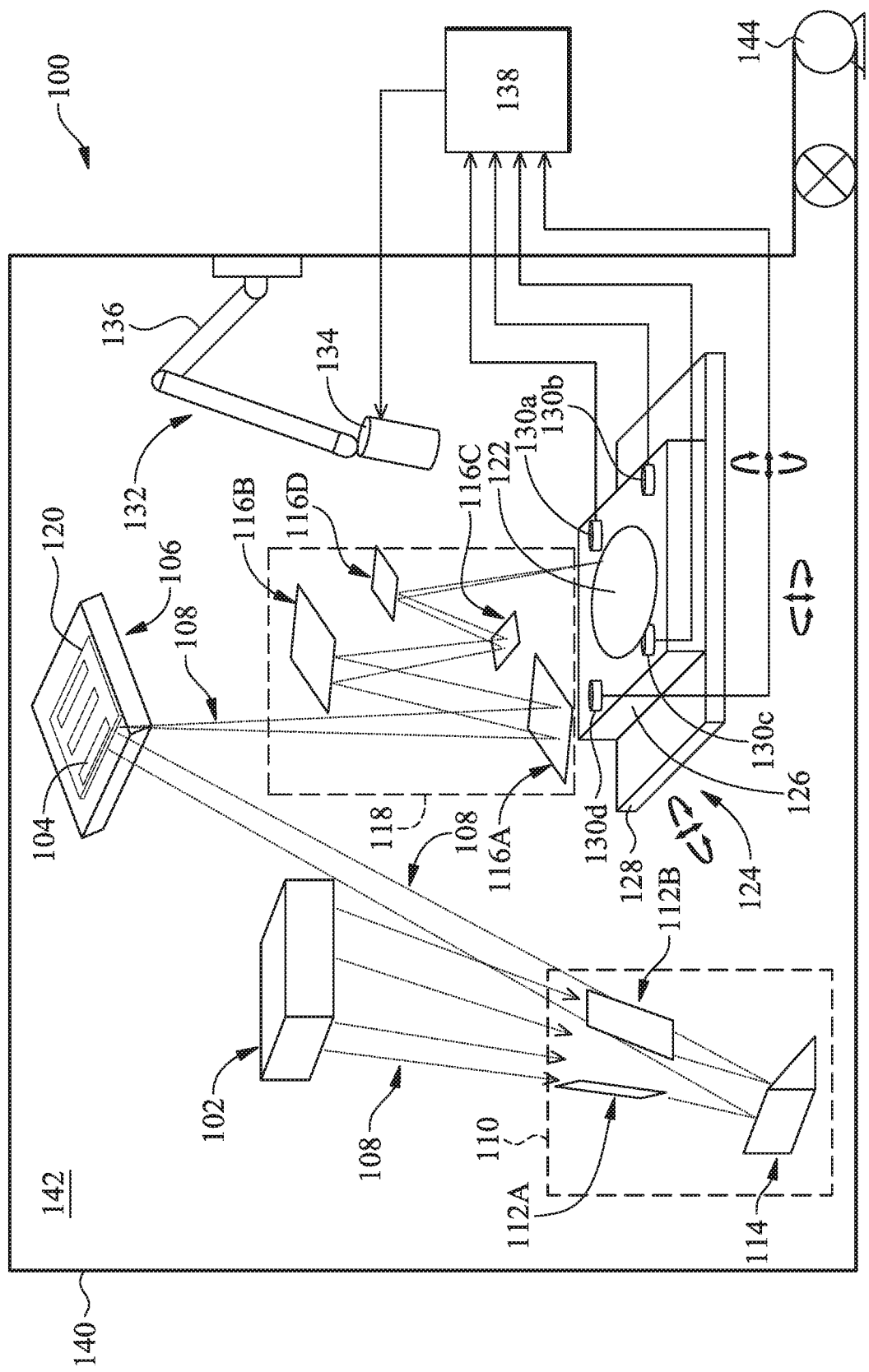
FIG. 1A is a schematic graph showing an extreme ultraviolet (EUV) illumination tool according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic graph showing an EUV illumination tool 100 according to some embodiments. The EUV illumination tool 100 includes a radiation source 102 configured to supply EUV radiation 108. The radiation source 102 may be a laser produced plasma source. A hot plasma may be produced from a gas or vapor, for example Xe gas, Li vapor, or Sn vapor, using a laser light to emit radiation in the EUV range. The radiation source 102 may produce a radiation having a wavelength in the range from about 5 nm to about 20 nm, for example, a wavelength of about 13.5 nm, or a wavelength from about 6.7 nm or about 6.8 nm. In some embodiments, the EUV illumination tool 100 is used to produce semiconductor devices at a 5 nm technology node.

The radiation source 102 emits the EUV radiation 108 to a condenser 110. The condenser 110 includes surfaces 112A, 112B configured to focus the EUV radiation 108 and a reflector 114 configured to reflect the EUV radiation 108 towards a reticle 104. The reticle 104 may be secured to a mask stage 106. The reticle 104 has a pattern surface 120 having a pattern to be transferred to a workpiece.

In this disclosure, the terms of reticle, mask, and photomask are used to refer to the same item. In the EUV illumination tool 100, the reticle 104 is a reflective mask. The reticle 104 may include a substrate, multiple reflective layers formed on the substrate, and a patterned layer formed over the multiple reflective layers. The substrate may be a substrate of a low thermal expansion material or fused quartz. A low thermal expansion material may include titanium dioxide ($TiO_2$) doped with silicon dioxide ($SiO_2$). The multiple reflective layers may include a plurality of film pairs, such as molybdenum-silicon (Mo/Si) film pairs, molybdenum-beryllium (Mo/Be) film pairs, or other suitable material pairs that are highly reflective to EUV lights. The patterned layer may be an absorption layer patterned with a pattern to define a layer of an integrated circuit. The absorption layer may be a tantalum boron nitride (TaBN) layer. Alternatively, the patterned layer may be a patterned reflective layer, thereby forming an EUV phase shift mask.

The pattern surface 120 of the reticle 104 reflects the radiation 108 from the condenser 110 towards a projection optics module 118. The projection optics module 118 includes a series of mirrors, such as mirrors 116A-116D. The mirrors 116A-116D function as lenses to reduce the size of the pattern carried by the EUV radiation 108.

During operation, the projection optics module 118 projects the EUV radiation 108 towards a substrate 122 disposed on a substrate stage 124. The substrate 122 may be a semiconductor substrate on which integrated circuit devices are to be formed. The substrate 122 may be a bulk semiconductor substrate (e.g., a wafer), a silicon on insulator (SOI) substrate, or the like. Materials of the substrate 122 can include silicon, silicon germanium, germanium, gallium arsenide, polysilicon, silicon oxide, carbon doped silicon oxide, silicon nitride, glass, and sapphire. It is contemplated that the substrate 122 is not limited to any particular size or shape. Therefore, the substrate 122 may be a circular substrate having a 200 mm diameter, a 300 mm diameter or other diameters, such as 450 mm, among others. The substrate 122 may also be any polygonal, square, rectangular, curved or otherwise non-circular workpiece.

The substrate 122 has a photoresist layer formed thereon. The EUV radiation 108 is incident on the radiation sensitive photoresist layer transferring the pattern carried in the EUV radiation 108 to the photoresist layer.

The photoresist layer may include any suitable photoresist material designed for the EUV wavelength. In some embodiments, the photoresist layer may include a chemically amplified resist (CAR). A CAR may be formulated by adding an organic polymer, a photo acid generator, and a quencher species together. Alternatively or additionally, the photoresist layer may include a metal based photoresist. For example, the photoresist layer may include a metal-oxide resist on top of a sacrificial carbon layer, such as spin-on-carbon. The photoresist layer may also be a tri-layer mask having a bottom layer, a middle layer, and a top layer. The bottom layer may be a carbon organic layer. The middle layer may be a silicon-containing carbon layer used to help pattern the bottom layer. The top layer may be any suitable photoresist material designed for exposure to the EUV wavelength.

The substrate stage 124 may include an electrostatic chuck 126 configured to secure the substrate 122 thereon during operation. The electrostatic chuck 126 may be formed from a rigid material having a low coefficient of thermal conductivity. The electrostatic chuck 126 may be connected to a number of actuators configured to the move electrostatic chuck in a number of degrees of freedom to focus the EUV radiation 108 on the substrate 122 and/or to align the pattern on the reticle 104 with a target portion on the substrate 122. In some embodiments, the substrate stage 124 may be configured to move the substrate 122 in six degrees of freedom—X, Y, Z, Rx, Ry, and Rz using any number of actuators, such as six actuators.

A number of sensors 130a, 130b, 130c, 130d (collectively sensors 130) may be disposed on a top surface 128 of the electrostatic chuck 126. The sensors 130 are positioned to be proximate to the substrate 122 during operation, for example near the edge of the substrate 122. The sensors 130 may be fixedly mounted on the electrostatic chuck 124 and may be used to evaluate and/or optimize imaging performance of the EUV illumination tool 100. One or more sensors 130 may include an upper plate that is transparent to radiation, such as radiation in the EUV wavelength, or may include a pattern of transparent portions and opaque portions. The upper plate may be positioned to receive radiation from the EUV radiation 108. The received radiation may be directed to one or more transducers in the sensor 130. The sensor 130 may include an optical element, such as a fiber optic plate or micro lens array, that is suitable to direct or focus the received radiation to the transducer. The transducer may be a device suitable to convert radiation to an electric signal, such as a photodiode, a CCD camera, or a CMOS camera. The output of the transducer may be used to control, calibrate, or optimize the operation of the EUV illumination tool 100.

In some embodiments, the sensors 130a, 130b may be transmission image sensors (TIS). A TIS sensor is used to measure the position of a projected aerial image of a mask pattern on the reticle 104 at the substrate level. The projected image at the substrate level may be a line pattern with a line having comparable wavelength to the wavelength of the radiation 108. The measurement of the TIS sensors 130a, 130b may be used to measure the position of the mask with respect to the substrate stage 124 in six degrees of freedom, e.g., three degrees of freedom in translation and three degrees of freedom in rotation. Additionally, magnification and scaling of the projected pattern may also be measured by the TIS sensors 130a, 130b. The TIS sensors 130a, 130b are capable of measuring pattern positions, influences of illumination settings, such as sigma, numerical aperture of lens. The TIS sensors 130a, 130b may be used to align the reticle 104 with the substrate 122, focus the EUV radiation 108 to a target region on the substrate 122, measure performance of the EUV illumination tool 100, and/or measure optical properties, such as pupil shape, coma, spherical aberration, astigmatism, and field curvature. Even though, two TIS sensors 130a, 130b are shown in FIG. 1A, less or more TIS sensors may be included according to the design of the illumination tool 100.

In some embodiments, the sensor 130c may be a spot sensor configured to measure a dose of EUV radiation at the substrate level. The measured EUV radiation by the spot sensor 130c at the substrate level can be used to calculate the EUV radiation absorbed by mirrors in the path of the EUV radiation 108 for compensating the effects of EUV radiation loss, which may improve optical performance of the EUV illumination tool 100.

In some embodiments, the sensor 130d is an integrated lens interferometer at scanner (ILIAS). An ILIAS sensor is an interferometric wave front measurement device that performs static measurement on lens aberrations up to high order. The ILIAS sensor 130d may be used to measure wavefront errors in the EUV radiation 108.

It should be noted that other sensors may be included in the substrate stage 124 to achieve target functions. Different sensors may be combined into one sensor to achieve multiple functions. For example a TIS sensor may be combined to with an ILIAS sensor to measure both projected aerial images and wavefront errors.

In some embodiments, the EUV illumination tool 100 includes a housing 140. The housing 140 defines an inner volume 142. A vacuum pump 144 may be connected to the housing 140 to establish a vacuum environment in the inner volume 142. The substrate stage 124 is disposed in the inner volume 142 so that the EUV lithographic process may be performed in a vacuum state.

Other components of the EUV illumination tool 100, such as the condenser 110, the mask stage 106, and the projection optics module 118, may be disposed in the housing 140 or in individual housings.

In some embodiments, the EUV illumination tool 100 includes a cleaning module 132 configured to remove contamination from inner surfaces of the illumination tool 100, such as outer surfaces of the sensors 130. Among other contaminations, the cleaning module 132 may be used to remove depositions on optical surfaces resulting from dissociation of the photoresist layers, lubricants, and uses of pumps.

The cleaning module 132 may include a radical generator 134 configured to provide radicals into the inner volume 142 to remove contaminations. The radical generator 134 may generate radicals using a hot filament, oscillating field electrode, a magnetron RF generator. For example, the radical generator 134 may be a hydrogen radical generator configured to generate hydrogen radicals using one or more hot filaments. Hydrogen radicals may react with contaminations, such as carbon deposits released by photoresist, to form volatile hydrocarbons, such as methane ($CH_4$). Volatile hydrocarbons may be removed from the inner volume 142 by the vacuum pump 144.

In some embodiments, the radical generator 134 is disposed in the inner volume 142. The cleaning module 132 may include an actuator assembly 136 configured to direct the radical generator 134 to a component to be cleaned, such as sensors 130. In some embodiments, the actuator assembly 136 is a robot.

The EUV illumination tool 100 further includes a controller 138 configured to perform a cleaning procedure according to some embodiments. The controller 138 may be configured to monitor one or more parameters of the EUV illumination tool 100 to determine whether a cleaning process should be started. In some embodiments, the controller 138 is connected to the sensors 130 to monitor one or more sensor measurements. Based on the monitored sensor measurements, the controller 138 will determine whether the sensors 130 need cleaning. The controller 138 sends commands to the radical generator 134 to perform a cleaning process.

Figure 1B:
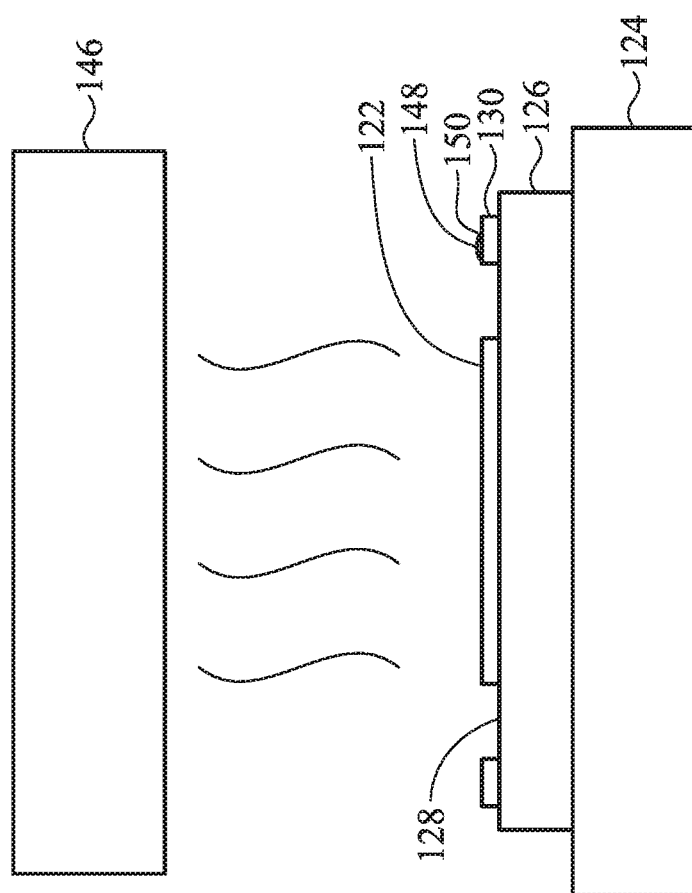
FIG. 1B is a partial sectional view of the EUV illumination tool showing sensors on a substrate stage according to some embodiments.

FIG. 1B is a partial sectional view of the EUV illumination tool 100 showing contamination on the sensors 130 mounted on the substrate stage 124. Photoresists, such as organic photoresists, may outgas hydrocarbons in the vacuum environment in the EUV illumination tool 100. The outgassed hydrocarbons may disassociate to carbon under the radiation, such as the EUV radiation 146 used to pattern the substrate 122. Overtime, carbon deposits may accumulate on an outer surface 150 of the sensors 130 forming a contamination 148 and causing the sensors 130 to lose accuracy. The outer surface 150 may be configured to receive radiation to complete measurements by the sensor 130. In addition to carbon, the EUV illumination tool 100 may include other elements released into the vacuum during EUV lithographic process, such as metals outgassed from metal oxide based photoresist, zinc released from solder or the EUV source, or zinc originated from trace element in stainless steel.

Contaminations 148 on the sensors 130 cause performance of the EUV illumination tool 100 to drift overtime. For example, carbon deposited on the upper surface of the TIS sensors 130*a*, 130*b* may cause the EUV illumination tool 100 to have a focus drift. In a continuously operating EUV illumination tool, TIS sensors on the substrate stage may have a focus drift at about 10 nm per month due to carbon deposit on the radiation receiving surface. Carbon deposited on the upper surface of the spot sensor 130*c* may cause the EUV illumination tool 100 to have a lot-to-lot critical dimension variation. In a continuously operating EUV illumination tool, spot sensors on the substrate stage may have a lot-to-lot critical dimension (CD LtL) variation of about 0.5 nm due to carbon deposit on the radiation receiving surface. Carbon deposited on the upper surface of the ILIAS sensor 130*d* may cause the EUV illumination tool 100 to have a proximity drift. In a continuously operating EUV illumination tool, ILIAS sensors on the substrate stage may have a proximity drift at about 1nm every six month due to carbon deposit on the radiation receiving surface.

After performing a number of exposures, depending on energy level used during exposure, lot size, and/or source power, an EUV illumination tool may have contamination built up on sensors and need cleaning. Typically, a continuously operating EUV illumination tool similar to the EUV illumination tool 100 is typically shut down for about 48 hours at least every six months to clean off the carbon deposits. The cleaning process typically takes about 24 hours to remove the carbon deposit and another 24 hours to recalibrate the EUV illumination tool 100. Carbon deposit on the sensors may be removed manually, or using a hydrogen radical generator. The calibration of the EUV illumination tool 100 includes performing pilot runs with batches of substrates. The long shut down time, materials, and labor involved increase cost of ownership of the EUV lithographic tools.

Embodiments as described herein provide a method for cleaning contamination from the sensors without requiring recalibration of the EUV illumination tool 100. More particularly, embodiments described herein permit cleaning the sensors using hydrogen radicals for a short period while the performance drifting is still above the drift tolerance without recalibrating the EUV illumination tool 100 after the cleaning.

Figure 1C:
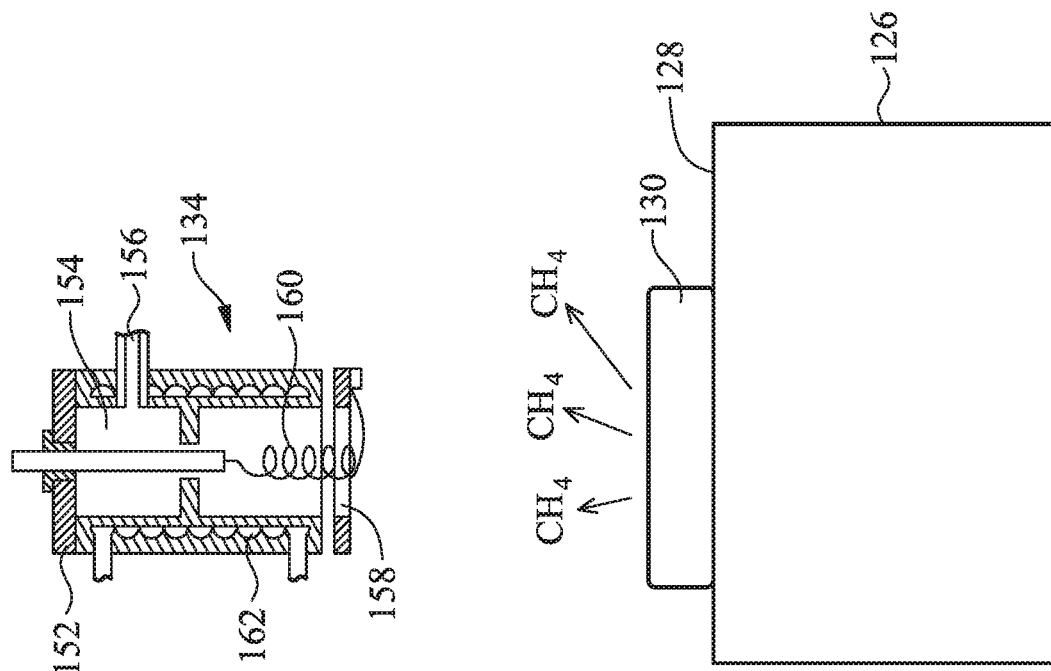
FIGS. 1C-1D are partial sectional views of the EUV illumination tool during a contamination removal process according to some embodiments.

The radical generator 134 may be used to deliver radicals, such as hydrogen radicals, towards the outer surface 150 of the sensors 130 to remove the contamination 148. FIG. 1C is a partial sectional view of the EUV illumination tool 100 showing contamination removal from the sensors 130 using the radical generator 134 according to some embodiments.

The radical generator 134 may include a housing 152 defining an inner volume 154. The housing 152 includes an inlet 156 for receiving a precursor gas from a gas source. The housing 152 also includes an outlet 158 configured to output radicals. One or more filaments 160 may be arranged in the inner volume 154 between the inlet 156 and the outlet 158. The filaments 160 may be a tungsten (W) or tantalum (Ta) wire or coil which can be heated by electricity. The filaments 160 may be heated to a desired temperature to dissociate bonds in molecules in the precursor gas to generate radicals. In some embodiments, the radical generator 134 further includes cooling pipes 162 wound around the housing 152. A cooling fluid, such as water, may circulate in the cooling pipes 162 to prevent the radical generator 134 from overheating the environment.

In some embodiments, a hydrogen containing gas may be provided to the inner volume 154 of the radical generator 152 through the inlet 154. The hydrogen containing gas may be a gas mixture including hydrogen molecules, such as hydrogen ($H_2$), hydrogen deuteride (HD), deuterium ($D_2$), hydrogen triteride (HT), and tritium ($T_2$). A mixture of hydrogen containing gas and noble gases, such as helium (He) may be supplied to the inlet 154. In some embodiments, the filament 160 may be heated to between about 1500° C. to about 3000° C. to generate hydrogen radicals from hydrogen molecules in the hydrogen containing gas.

During operation, the radical generator 134 may be moved adjacent to the sensor 130 to be cleaned, for example using the actuator assembly 136 attached to the radical generator 134. In some embodiments, the outlet 158 may be pointed toward the outer surface 150 of the sensor 130. In some embodiments, the outlet 158 of the radical generator 134 may be positioned at a distance of less than about 5 cm to the outer surface 150. Positioning the radical generator 134 close to the sensors 130 prevents hydrogen radicals from diffusing away, which may improve efficiency.

Additionally, positioning the radical generator 134 close to the sensors 130 can also reduce hydrogen radicals reacting with other components in the EUV illumination tool 100, such as reflective surfaces on the mirrors. Contaminations of other type, such as tin, zinc, metals, or metal oxides, may react with hydrogen radicals to form metal hydride which may redeposit on optical elements damaging the optical elements.

Figure 1D:
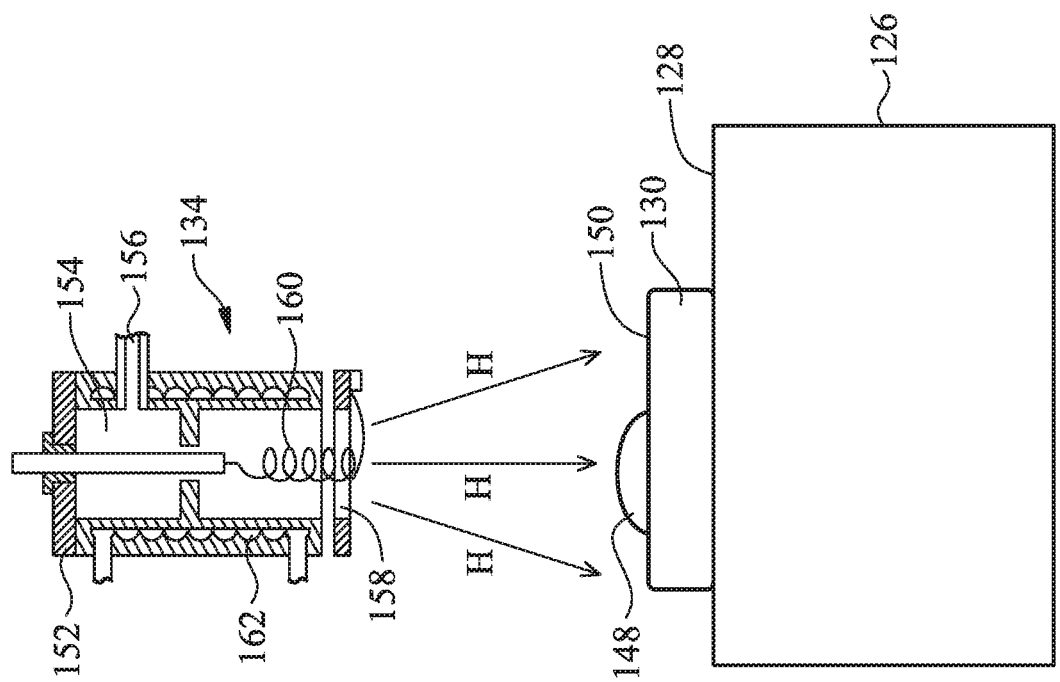

As shown in FIG. 1C, hydrogen radicals are dispatched from the radical generator 134 toward the sensor 130 to remove the contamination 148. As shown in FIG. 1D, the hydrogen radicals react with carbon in the contamination 148 to form methane, which is volatile, thus removing the hydrogen contamination from the sensor 130.

In some embodiments, the cleaning process shown in FIGS. 1C-1D may be a mini cleaning session carried out during operation before the contamination causes the amount of performance drift that would trigger a normal cleaning session, which is usually preprogrammed in the EUV illumination tools by the manufacturer. In some embodiments, the mini cleaning session lasts only a fraction of downtime of a normal cleaning process. In another embodiment, the mini cleaning session is a local cleaning session that only involves one sensor or a portion of the sensors and is performed only for a fraction of normal cleaning time. Alternatively, the mini cleaning session may be performed using a different recipe than the normal cleaning process, for example, with a higher or lower partial pressure of the hydrogen radicals or with a variation of precursors in addition to shortened cleaning time.

According to embodiments described herein, the mini cleaning session may be triggered when one or more sensor measurements reach a threshold value. In the normal cleaning process, the sensors 130 are cleaned when the measurements of the sensors 130 are affected by the contaminations thereon causing the performance drift of the EUV illumination tool 100 to reach or close to reaching the performance drift tolerance for the process. Unlike the normal cleaning process, the mini cleaning session according to some embodiments is performed when a sensor measurement indicates some degree of contamination accumulation but before the performance drift has occurred or the amount of performance drift warrants a normal cleaning process. Unlike in the normal cleaning process, recalibration or pilot runs may be obviated performed after each mini cleaning session, which may further reduce downtime and eliminate cost of raw materials used during recalibration and pilot runs.

Figure 2B:
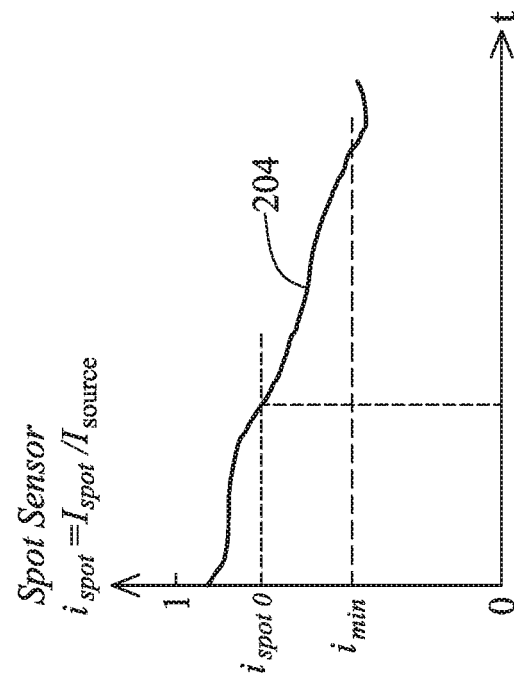
Figure 2A:
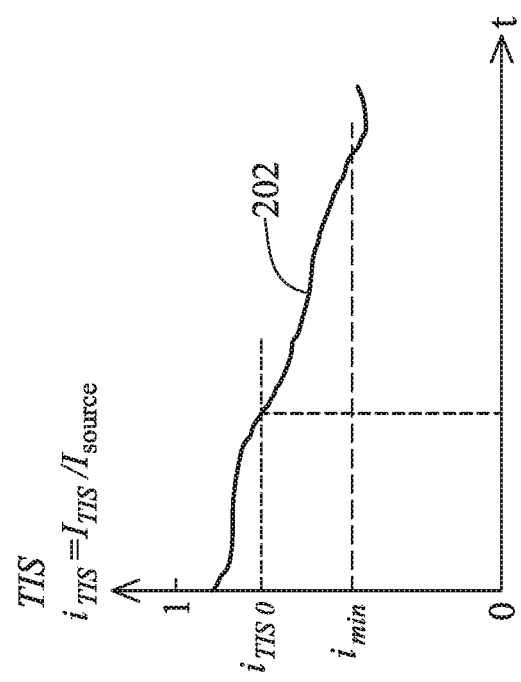

FIGS. 2A-2C are schematic plots of monitored sensor measurements in the EUV illumination tool 100 according to some embodiments. FIG. 2A shows a curve 202 of relative radiation intensity $i_{TIS}$ received by a TIS sensor, such as the TIS sensors 130a, 130b, over time. The relative radiation intensity $i_{TIS}$ is a ratio of absolute radiation intensity $I_{TIS}$ received by a TIS sensor positioned at the substrate stage over absolute source radiation intensity $I_{source}$ dispatched by a radiation source, such as the EUV source 102. The absolute radiation intensity $I_{TIS}$ may be obtained through transducers in the TIS sensor, such as the TIS sensors 130a, 130b.

The absolute source radiation intensity $I_{source}$ may be obtained from sensors in the EUV radiation source 102. Alternatively or additionally, the absolute radiation intensity of the EUV radiation beam measured in other components upstream to the TIS sensors, such as the condenser 110, the mask stage 106, and/or the projection optics module 118, may be used as the absolute source radiation intensity $I_{source}$ in calculating the relative radiation intensity $i_{TIS}$.

A decreased relative radiation intensity $i_{TIS}$ indicates an intensity loss caused by contamination on the radiation receiving outer surface of the TIS sensor, such as the outer surface 150. FIG. 2A illustrates how the relative radiation intensity $i_{TIS}$ received by the TIS sensor is monitored and used as a trigger to start a mini cleaning session according to some embodiments. As shown in FIG. 2A, the relative radiation intensity $i_{TIS}$ decreases over time due to accumulation of contamination, such as the carbon deposits. When the relative radiation intensity $i_{TIS}$ reaches a threshold value $i_{TIS0}$, a mini cleaning session may be started. In some embodiments, the threshold value $i_{TIS0}$ may be above about 0.6. For example, the threshold value $i_{TIS0}$ may be in a range from about 0.6 to about 0.9. In some embodiments, the threshold value $i_{TIS0}$ may be about 0.9. In some embodiment, the threshold value $i_{TIS0}$ may vary depending on the source of the absolute source radiation intensity $I_{source}$. For example, a lower threshold value $i_{TIS0}$ may be selected when the absolute source radiation intensity $I_{source}$ is obtained from a component further upstream from the TIS sensor to be cleaned considering intensity loss in a longer reflection path.

FIG. 2B shows a curve 204 of relative radiation intensity $i_{spot}$ received by a spot sensor, such as the spot sensors 130c, over time. The relative radiation intensity $i_{spot}$ is a ratio of absolute radiation intensity $I_{spot}$ received by a spot sensor positioned at the substrate stage over absolute source radiation intensity $I_{source}$ dispatched by a radiation source, such as the EUV source 102. The absolute radiation intensity $I_{spot}$ may be obtained through transducers in the spot sensor, such as the spot sensor 130c.

A decreased relative radiation intensity $i_{spot}$ indicates an intensity loss caused by contaminations on the radiation receiving outer surface of the spot sensor, such as the outer surface 150. FIG. 2B illustrates how the relative radiation intensity $I_{TIS}$ received by the spot sensor is monitored and used as a trigger to start a mini cleaning session according to embodiments of the present disclosure. As shown in FIG. 2B, the relative radiation intensity $i_{spot}$ decreases over time due to accumulation of contamination, such as the carbon deposits. When the relative radiation intensity $i_{spot}$ reaches a threshold value $i_{spot}$ a mini cleaning session may be started. In some embodiments, the threshold value $i_{spot0}$ may be above about 0.6. For example, the threshold value $i_{spot0}$ may be in a range from about 0.6 to about 0.9. In some embodiments, the threshold value $i_{spot0}$ may be about 0.9. In some embodiment, the threshold value $i_{spot0}$ may vary depending on the source of the absolute source radiation intensity $I_{source}$. For example, a lower threshold value $i_{spot0}$ may be selected when the absolute source radiation intensity $I_{source}$ is obtained from a component further upstream from the spot sensor to be cleaned considering the longer reflection path.

FIG. 2C shows a curve 206 of aberrations a measured by an ILIAS sensor, such as the ILIAS sensor 130d, over time. The aberrations a may be measured by a transducer in the ILIAS sensor receiving the EUV radiation in the EUV illumination system 100. An increase in aberrations a indicates a change in optical properties of the ILIAS sensor caused by contaminations on the radiation receiving outer surface of the ILIAS sensor, such as the outer surface 150.

FIG. 2C illustrates how the aberrations a measured by the ILIAS sensor is monitored and used as a trigger to start a mini cleaning session according to some embodiments. As shown in FIG. 2C, the measured aberrations a increase over time due to accumulation of contamination, such as the carbon deposits. When the measured aberration a reaches a threshold value $a_0$, a mini cleaning session may be started. In some embodiments, the threshold value $a_0$ may be in a range from about 0.2 nm to about 0.3 nm.

FIG. 3 is a schematic flow chart of a method 300 for patterning semiconductor substrates according to some embodiments. The method 300 relates to patterning semiconductor substrates by an EUV lithographic process. The method 300 may be performed using the EUV illumination tool 100 described above. In some embodiment, the method 300 is started after a normal cleaning process. Operations 310, 320, 330 are performed in loops without interruptions of any additional normal cleaning process or recalibration process.

Operation 310 in the method 300 includes patterning semiconductor substrates using an EUV tool, such as the EUV illumination tool 100, while monitoring sensor measurements in the EUV tool. Semiconductor substrates having a photoresist layer formed thereon may be patterned consecutively in the EUV tool. One or more sensors, such as a TIS sensor, a spot sensor, and an ILIAS sensor, may be mounted on a substrate stage in the EUV tool and used to control, monitor, evaluate, and/or optimize imaging performance of the EUV tool.

One or more sensor measurements from at least one of the sensors may be monitored during the patterning process. In some embodiments, the one or more sensor measurement indicates an amount of contamination accumulated on an outer surface of the corresponding sensor. The outer surface is configured to transmit radiation to a transducer in the corresponding sensor. In some embodiments, the outer surface is a surface of a cover plate that is entirely transparent or has one or more portions transparent to radiation in the wavelength used for patterning the substrates.

In some embodiments, a measurement of each sensor having a viewport for receiving radiation may be monitored. Alternatively or additionally, only measurement by one or more representative sensors may be monitored. In some embodiments, the one or more sensor measurements include a relative radiation intensity $i_{TIS}$ received by a TIS sensor, such as the TIS sensors 130a, 130b. The one or more sensor measurements may also include relative radiation intensity $i_{spot}$ received by a spot sensor, such as the spot sensors 130c. The one or more sensor measurements may also include aberrations a measured by an ILIAS sensor, such as the ILIAS sensor 130d.

In some embodiments, the one or more sensors in the EUV tool are at a pristine condition when operation 310 starts. The pristine condition may be the condition immediately after a normal cleaning process.

In operation 320, the sensor measurement(s) may be analyzed to determine whether to start a mini cleaning session. The determination may be performed in a system controller, such as the controller 138 in the EUV illumination tool 100. Whether to start a mini cleaning session may be determined based on if at least one of the sensor measurements has reached a corresponding threshold value.

For each TIS sensor, a relative radiation intensity $i_{TIS}$ may be monitored and the corresponding threshold value $i_{TIS0}$ may be above about 0.6, such as in a range from about 0.6 to about 0.9. In some embodiments, the threshold value $i_{TIS0}$ may be about 0.9.

For each spot sensor, a relative radiation intensity $i_{spot}$ may be monitored and the corresponding threshold value $i_{spot0}$ may be above about 0.6, such as in a range from about 0.6 to about 0.9. In some embodiments, the threshold value $i_{spot0}$ may be about 0.9.

For each ILIAS sensor, a measured aberration a may be monitored. In some embodiments, the threshold value $a_0$ for the measured aberration a may be between about 0.2 nm to about 0.3 nm.

In some embodiments, a mini cleaning session may be started when one sensor measurement reaches the corresponding threshold value. Alternatively, a mini cleaning session may be started when two or more sensor measurements reach the corresponding threshold values. In other embodiments, a mini cleaning session may be started when a predetermined portion of the sensor measurements, such as 50% of monitored sensor measurements, reach the corresponding threshold value.

If it is determined in operation 320 that the conditions to start a mini cleaning session have not been met, patterning in operation 310 can continue. If it is determined in operation 320 that the conditions to start a mini cleaning session have been met, the operation of the EUV illumination tool of operation 310 will be stopped (e.g., after patterning one or more substrate and before patterning another one or more substrate) and operation 330 started to perform a mini cleaning session.

The mini cleaning session may last only a fraction of the downtime of a normal cleaning process. In some embodiments, a mini cleaning session may only take about 2% to 5% of the downtime used in a normal cleaning process. For example, the mini cleaning session may take between about 30 minutes to about 60 minutes downtime.

In some embodiments, the duration of a mini cleaning session is selected to return the sensor conditions to or near to the pristine conditions, which are the conditions at the beginning of operation 310. In some embodiments, the duration of the mini cleaning session is a fixed according to empirical results. In some embodiments, the duration of the mini cleaning session may be selected from a look up table of a series of monitored sensor conditions and a series of cleaning durations. The look up table may be obtained by experiments. A longer mini cleaning session corresponds to more contamination formed over the sensors, and vice versa. In some embodiments, the mini cleaning session may be performed using the same cleaning device and cleaning recipe used in the normal cleaning process except that the mini cleaning session is performed at a fraction of time. For example, the mini cleaning session may be performed using a factory cleaning recipe supplied by the EUV tool manufacturer with an adjustment for cleaning time.

Alternatively or additionally, the mini cleaning session may be a local cleaning session that only involves one or a portion of the sensors and is performed only for a fraction of normal cleaning time. Alternatively or additionally, the mini cleaning session may be performed using a different recipe than the normal cleaning process, for example with a higher or lower partial pressure of the hydrogen radicals or with a variation of precursors in addition to shortened cleaning time.

In some embodiments, the mini cleaning session includes generating hydrogen radicals using a hydrogen radical generator and delivering the hydrogen radicals towards the sensors to be cleaned. Contaminations accumulated over the sensors may react with the hydrogen radicals to form volatile hydrocarbons, such as methane, which can be removed from the inner volume of the EUV tool.

In some embodiments, the mini cleaning session includes moving the hydrogen radical generator toward the one or more sensors to be cleaned, generating and supplying hydrogen radicals to the sensors to remove contamination therefrom.

After the mini cleaning session in operation 330, the method 300 continues with the operation of the EUV illumination tool to perform the patterning process in operation 310 without going through a calibration process typically following a normal cleaning process of the EUV tool.

Figure 4:
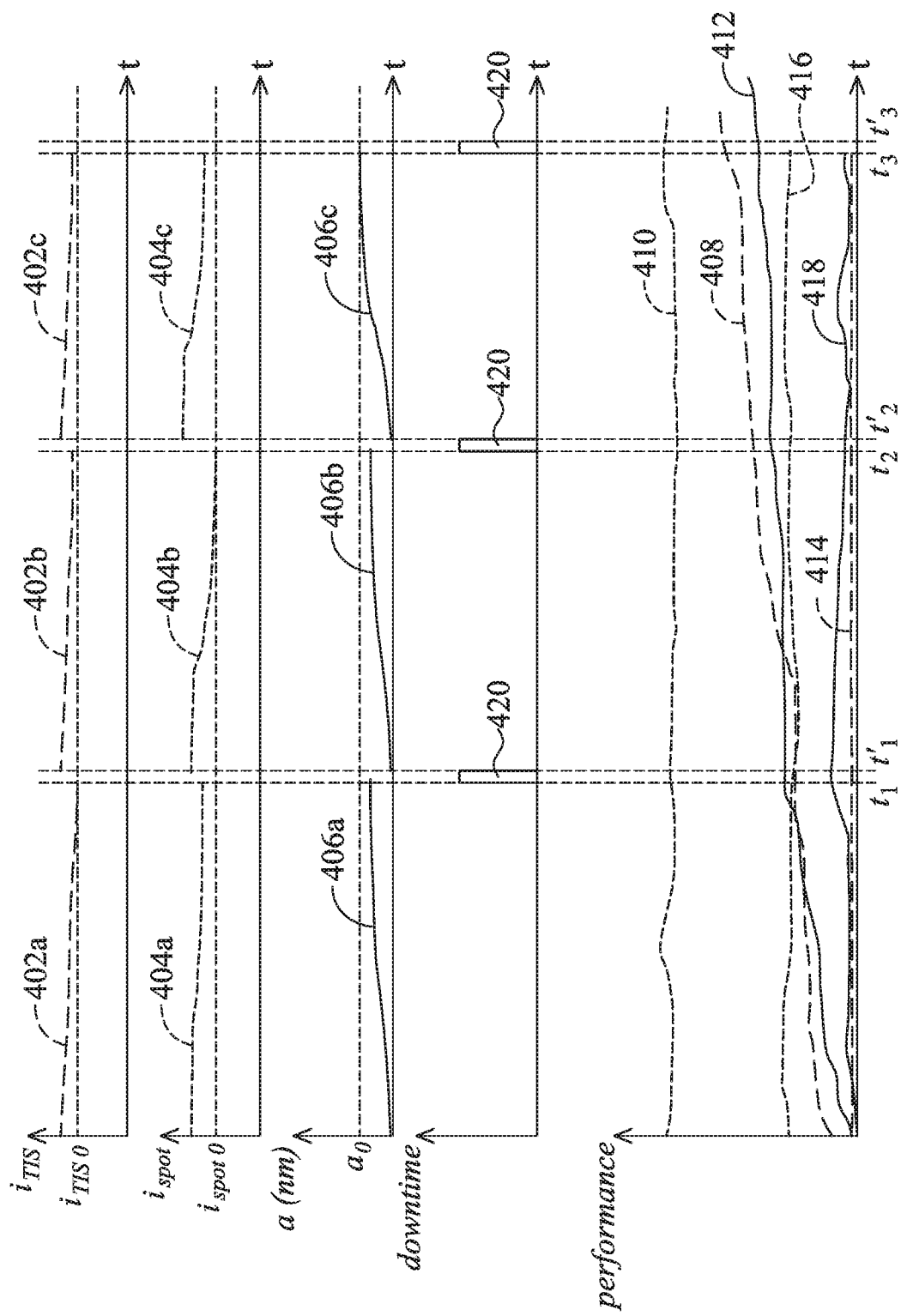
FIG. 4 is a schematic plot showing sensor readings during EUV lithography with contamination removal sections according to some embodiments.

During traditional operation of the EUV tool, sensor measurements and/or a substrate being processed are monitored to determine whether a normal cleaning process is needed. The EUV tool is shut down for a normal cleaning when the sensor measurements reach threshold values or performance data indicates a substantial performance drift. Under the conditions triggering a normal cleaning process, performance of the sensors is also drifted far enough and the sensors need to be recalibrated after the normal cleaning process. The sensor calibration process adds additional down time to the EUV tool. As illustrated in FIG. 4, when performing mini cleaning sessions as described herein, the sensors performance does not drift far enough between cleaning sessions to trigger a recalibration process. As a result, the overall performance can be improved and the down time can be reduced.

FIG. 4 includes plots showing sensor measurements and performance results of an exemplary EUV lithography process with contamination removal sessions according to some embodiments. The exemplary EUV lithography process may be performed using a method similar to the method 300 described above. The EUV lithography process may be performed using an EUV illumination tool similar to the EUV illumination tool 100. The EUV illumination tool includes at least a TIS sensor, a spot sensor, and an ILIAS sensor mounted on a substrate stage configured to monitor, evaluate, control, and/or optimize the image performance of the EUV illumination tool.

During the exemplary EUV lithography process of FIG. 4, condition of the TIS sensor may be monitored through a relative radiation intensity $i_{TIS}$ calculated from measurement by the TIS sensor. Curves 402a, 402b, and 402c are schematic plots of the relative radiation intensity $i_{TIS}$. Condition of the spot sensor may be monitored through a relative radiation intensity $i_{spot}$ calculated from measurements of the spot sensor. Curves 404a, 404b, and 404c are schematic plots of the relative radiation intensity $i_{spot}$. Conditions of the ILIAS sensor may be monitored using aberrations a measured by the ILIAS sensor. Curves 406a, 406b, and 406c are schematic plots of the aberration a.

Line segments 420 includes mini cleaning sessions performed during the exemplary lithography process. A first mini cleaning session was performed at time $t_1$ when the relative radiation intensity $i_{TIS}$ calculated from measurement by the TIS sensor reaches the threshold value. After the first mini cleaning session, the patterning process resumes at time $t'_1$ and all sensor measurements have improved from the measurements at time $t_1$. A second mini cleaning session was performed at time $t_2$ when the relative radiation intensity $i_{spot}$ calculated from measurement by the spot sensor reaches the threshold value. After the second mini cleaning session, the patterning process resumes at time $t'_2$ and all sensor measurements have improved from the measurements at time $t_2$. A third mini cleaning session was performed at time $t_3$ when the aberration measurement by the ILIAS sensor reaches the threshold value.

In some embodiments, the time gap between $t_1$ and $t_2$ and time gap between $t_2$ and $t_3$ is about one week. The time gaps between $t_1$ and between $t_2$ and $t'_2$, and between $t_3$ and $t'_3$ are in a range from about 30 minutes to about 60 minutes. The sum of downtime of mini cleaning sessions over a six month period under these circumstances would be between 13 hours to 26 hours, a reduction of more than 50% of downtime compared to the normal cleaning process with about 48 hours of downtime.

Curves 408, 410, 412 are schematic plot of focus drift, CD LtL variation, and proximity drift of the EUV tool without mini cleaning sessions. Curves 414, 416, 418 are schematic plot of focus drift, CD LtL variation, and proximity drift of the EUV tool the mini cleaning sessions. As shown by curves 408, 412, 414, 418 the focus drift and proximity drift increase over time when no mini cleaning sessions are performed while the focus drift and proximity drift are almost undetectable with the mini cleaning sessions. Through the comparison of curves 410 and 416, the CD LtL variation reduces about 60% by performing the mini cleaning session.

Even though the above description relates to removing contamination from sensors in an EUV illumination tool, embodiments of the present disclosure can be used to remove contaminations from other components in an EUV illumination tool, such as from the mask stage and the optics. Even though EUV lithographic tools and processes are described above, embodiments of the present disclosure may be used in any lithographic tools operating in a vacuum condition to remove contamination from internal components, such as sensors.

Embodiments of the present disclosure includes a method for lithographic process with mini cleaning sessions for remove contamination from sensors in a lithographic tool, such as an EUV tools. The mini cleaning sessions provide several advantages. For example, by performing mini cleaning sessions, downtime is reduced by illuminating the recalibration or pilot run process following normal cleaning process. Further, the sum of downtime of mini cleaning sessions is shorter than the downtime of the normal cleaning process. Additionally, the mini cleaning sessions ensure that the sensors are at a higher level of cleanness compared to using the normal cleaning process, thus, improve overall imaging performance of the lithographic tool.

Some embodiments provide a method. The method includes monitoring a sensor measurement indicative of an amount of contamination formed on a radiation receiving surface over a sensor in a lithography tool, and performing a cleaning session in the lithography tool when the sensor measurement reaches a threshold value. The cleaning session comprises providing radicals to the radiation receiving surface. After the cleaning session, the sensor is operable to provide the sensor measurement without being recalibrated Some embodiments provide a method. The method includes patterning semiconductor substrates sequentially using a lithography tool while monitoring a sensor measurement of a sensor in the lithography tool, performing a cleaning session in the lithography tool when the sensor measurement reaches a threshold value, and resuming patterning semiconductor substrates sequentially using the lithography tool. During resuming patterning the semiconductor substrates, the sensor is operable to provide the sensor measurement without being recalibrated after the cleaning session.

Some embodiments provide a lithography tool. The tool includes a housing defining an inner volume, a substrate stage configured to secure and move a substrate in the inner volume, a sensor mounted on the substrate stage, wherein the sensor includes an outer surface configured to receive radiation, a radical generator configured to deliver radicals to the inner volume, and a controller communicatively coupled to the sensor and the radical generator. The controller is configured to monitor a sensor measurement from the sensor indicative of an amount of contamination formed on the outer surface of the sensor, and cause the radical generator to perform a cleaning session when the sensor measurement reaches a threshold value. The cleaning session includes providing radicals from the radical generator to the outer surface of the sensor, and the sensor is operable to provide the sensor measurement after the cleaning without recalibration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for removing contamination from a lithographic tool, the apparatus comprising:
    a sensor that measures an amount of contamination formed on a radiation receiving surface over the sensor in a lithography tool; and
    a cleaning module that performs a cleaning session in the lithography tool when the sensor measures a relative radiation intensity reaches a threshold value, wherein the cleaning module includes a radical generator configured to provide radicals to the radiation receiving surface, wherein after the cleaning session, the sensor provides the sensor measurement without being recalibrated,
    wherein the sensor is a spot sensor mounted on a substrate stage in the lithography tool, and the sensor measurement includes the relative radiation intensity defined by a ratio of a radiation intensity measured by the spot sensor through the radiation receiving surface over a radiation intensity dispatched from a radiation source.

2. The apparatus of claim 1, wherein the threshold value of the relative radiation intensity is in a range from 0.6 to 0.9.

3. The apparatus of claim 1, wherein the spot sensor measures a lot-to-lot critical dimension variation (CD LtL) caused by carbon deposited on an upper surface of the spot sensor.

4. The apparatus of claim 3, wherein the threshold value of the lot-to-lot critical dimension variation (CD LtL) is less than 0.5 nm.

5. The apparatus of claim 1, wherein the sensor further includes an ILIAS (integrated lens interferometer at scanner) sensor mounted on a substrate stage in the lithography tool, and the sensor measurement includes an aberration of a radiation received by the ILIAS sensor through the radiation receiving surface measured by the ILIAS sensor.

6. The apparatus of claim 5, wherein the threshold value of the aberration of the radiation received by the ILIAS sensor is in a range from 0.2 nm to 0.3 nm.

7. The apparatus of claim 1, wherein the cleaning session comprises generating hydrogen radicals using an internal radical generator.

8. The apparatus of claim 7, wherein the cleaning session further comprises moving the hydrogen radical generator towards the sensor before generating hydrogen radicals.

9. A cleaning device comprising:
    semiconductor substrates sequentially patterning by a lithography tool while monitoring a sensor measurement of a sensor in the lithography tool; and
    the cleaning device that performs a cleaning session in the lithography tool when the sensor measurement including a relative radiation intensity reaches a threshold value; and
    the semiconductor substrates resuming patterning by the lithography tool, wherein during resuming patterning the semiconductor substrates, the sensor provides the sensor measurement without being recalibrated after the cleaning session,
    wherein the sensor is a TIS (transmission image sensor) sensor mounted on a substrate stage in the lithography tool, and the sensor measurement includes the relative radiation intensity measured by the TIS sensor.

10. The cleaning tool of claim 9, wherein the threshold value of the relative radiation intensity is in a range from 0.6 to 0.9.

11. The cleaning tool of claim 9, wherein the sensor measurement is indicative of an amount of contamination formed on a radiation receiving surface over the sensor.

12. The cleaning tool of claim 9, wherein the sensor measurement further includes at least one selected from the group of:
    a first relative radiation intensity defined by ratio of a radiation intensity measured by a TIS sensor through a radiation receiving surface of the TIS sensor over a radiation intensity dispatched from a radiation source,
    a second relative radiation intensity defined by a ratio of a radiation intensity measured by a spot sensor 130c through a radiation receiving surface of the spot sensor 130c over the radiation intensity dispatched from the radiation source, and
    an aberration of a radiation received by an ILIAS sensor through a radiation receiving surface of the ILIAS sensor.

13. The cleaning tool of claim 12, wherein the sensor measurement includes at least two sensor measurements selected from the group of the first relative radiation intensity, the second relative radiation intensity, and the aberration, and wherein the cleaning session is performed when at least one of the sensor measurements reaches a corresponding threshold value.

14. The cleaning tool of claim 12, wherein the sensor measurement includes the first relative radiation intensity, the second relative radiation intensity, and the aberration, and wherein the cleaning session is performed when all of the sensor measurements reach corresponding threshold values.

15. The cleaning tool of claim 12, wherein the cleaning session is performed for a duration in a range from about 30 minutes to about 60 minutes.

16. The cleaning tool of claim 9, wherein performing the cleaning session comprises generating hydrogen radicals using an internal radical generator.

17. The cleaning tool of claim 9, wherein performing the cleaning session comprises performing a pre-programmed cleaning process for a duration that is between about 2% and about 5% of a pre-defined duration of a full cleaning session.

18. The cleaning tool of claim 9, wherein performing the cleaning session comprises moving the hydrogen radical generator towards the sensor before generating hydrogen radicals.

19. A lithography tool, comprising:
    a housing defining an inner volume;
    a substrate stage configured to secure and move a substrate in the inner volume;

a sensor mounted on the substrate stage, wherein the sensor includes an outer surface configured to receive radiation;
a radical generator configured to deliver radicals to the inner volume; and
a controller communicatively coupled to the sensor and the radical generator, the controller being configured to:
monitor a sensor measurement from the sensor indicative of an amount of contamination formed on the outer surface of the sensor; and
cause the radical generator to perform a cleaning session when the sensor measurement reaches a threshold value, the cleaning session comprising providing radicals from the radical generator to the outer surface of the sensor, the sensor being operable to provide the sensor measurement after the cleaning without recalibration,
wherein the sensor is selected from a group consisting of a TIS (transmission image sensor) sensor, a spot sensor, and an ILIAS (integrated lens interferometer at scanner) sensor mounted on a substrate stage in the lithography tool.

20. The lithography tool of claim 19, wherein:
the sensor measurement includes at least one of:
a relative radiation intensity defined by ratio of a radiation intensity measured by the TIS sensor through an outer surface of the TIS sensor over a radiation intensity dispatched from a radiation source, and
a relative radiation intensity defined by a ratio of a radiation intensity measured by the spot sensor through an outer surface of the spot sensor over the radiation intensity dispatched from the radiation source.

* * * * *